US009239060B2

(12) United States Patent
Heymann

(10) Patent No.: US 9,239,060 B2
(45) Date of Patent: Jan. 19, 2016

(54) BLOWER ASSEMBLY FOR ELECTRONIC DEVICE

(71) Applicant: Intel Corporation, Santa Clara, CA (US)

(72) Inventor: Douglas Heymann, Hillsboro, CA (US)

(73) Assignee: Intel Corporation, Santa Clara, CA (US)

( * ) Notice: Subject to any disclaimer, the term of this patent is extended or adjusted under 35 U.S.C. 154(b) by 569 days.

(21) Appl. No.: 13/630,918

(22) Filed: Sep. 28, 2012

(65) Prior Publication Data

US 2014/0092553 A1 Apr. 3, 2014

(51) Int. Cl.
*F04D 17/04* (2006.01)
*F04D 25/06* (2006.01)
*F04D 29/42* (2006.01)
*H05K 7/20* (2006.01)

(52) U.S. Cl.
CPC ............ *F04D 17/04* (2013.01); *F04D 25/0613* (2013.01); *F04D 29/4226* (2013.01); *H05K 7/20172* (2013.01)

(58) Field of Classification Search
CPC .. F04D 17/04; F04D 25/0613; F04D 29/4226
USPC ................................. 415/53.1, 203
See application file for complete search history.

(56) References Cited

U.S. PATENT DOCUMENTS 5,879,141 A * 3/1999 Yokozawa et al. ......... 417/423.7
6,111,748 A * 8/2000 Bhatia ........................... 361/695
2004/0184914 A1 * 9/2004 Doege et al. ................... 415/220
2010/0172095 A1 * 7/2010 MacDonald et al. ......... 361/695
2012/0002368 A1   1/2012 Broili et al.
2012/0207596 A1 * 8/2012 Chou et al. ..................... 415/224
2013/0149128 A1 * 6/2013 Yin et al. ....................... 415/203

FOREIGN PATENT DOCUMENTS

| CN | 2450412 Y   | 9/2001 |
| CN | 101725562 A | 6/2010 |
| CN | 201590960 U | 9/2010 |
| CN | 102536860 A | 7/2012 |
| EP | 1657447 A2  | 5/2006 |

OTHER PUBLICATIONS

Office Action received for Chinese Patent Application No. 201310449693.8, mailed on Aug. 5, 2015, 8 pages.
Office Action received for Taiwanese Patent Application No. 102131804, mailed on Aug. 14, 2015, 9 pages including 4 pages of English Translation.

* cited by examiner

*Primary Examiner* — Edward Look
*Assistant Examiner* — Juan G Flores
(74) *Attorney, Agent, or Firm* — Alpine Technology Law Group LLC

(57) ABSTRACT

In one embodiment a blower comprises a case comprising a first surface, a second surface opposite the first surface, and a side wall extending between portions of the first surface and the second surface, wherein the side wall comprises an air inlet and an air outlet, an impeller disposed in the case and rotatable about an axis of rotation extending between the first surface and the second surface. Portions of the side wall are disposed at least a first distance from the axis of rotation and the impeller is to define a circumferential airflow path within the case, and the impeller is to create an airflow in the circumferential airflow path between the air inlet and the air outlet.

15 Claims, 4 Drawing Sheets

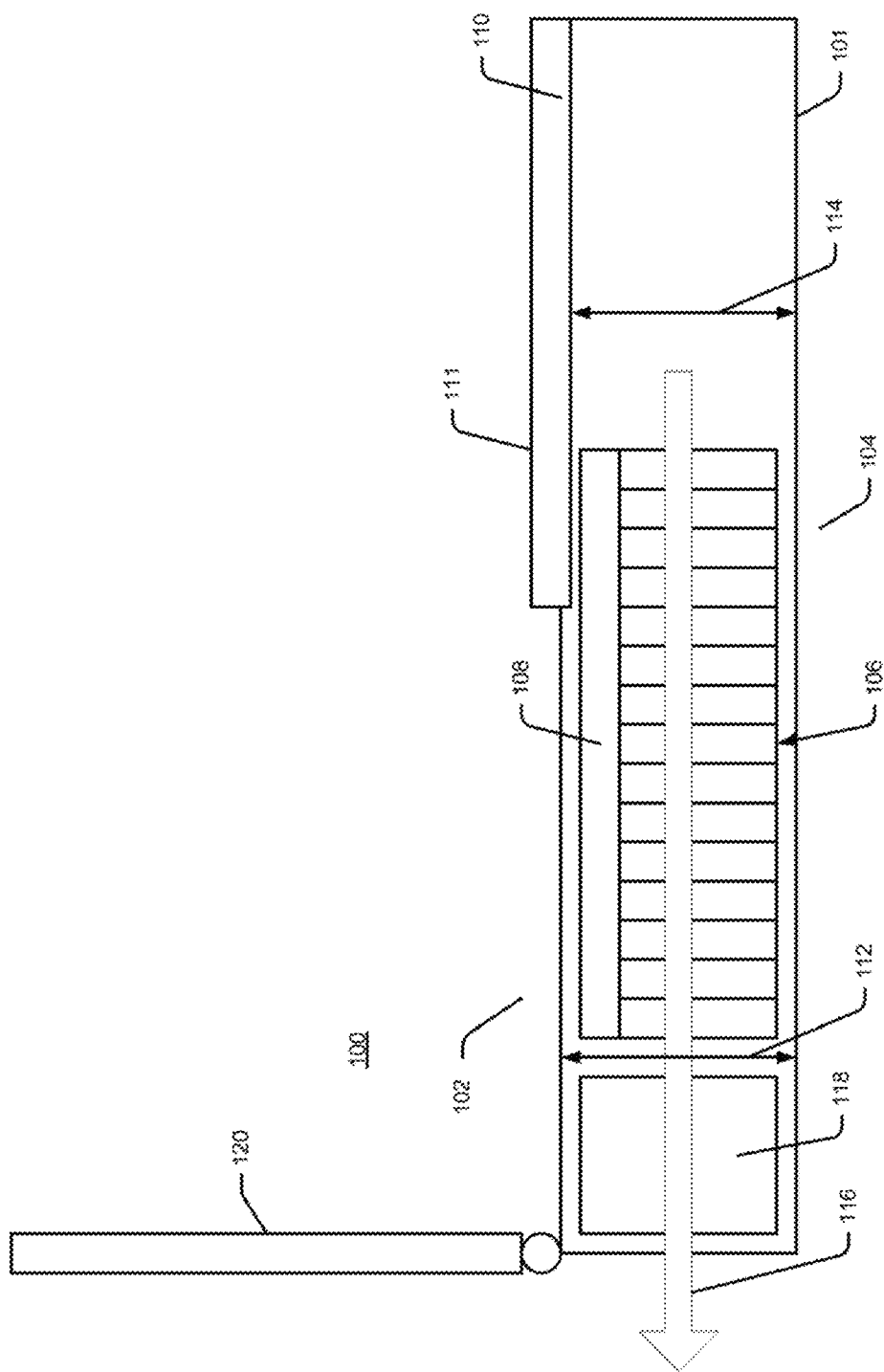

BLOWER ASSEMBLY FOR ELECTRONIC DEVICE

RELATED APPLICATIONS

None.

BACKGROUND

The subject matter described herein relates generally to the field of electronic devices and more particularly to a blower assembly for one or more electronic devices.

Modern computing systems generate heat during operation. The heat may affect certain platform components of a system, and is therefore generally required to be dissipated or removed from the system. Heat generated by the computing system may be limited or reduced using various thermal management techniques and/or heat dissipation techniques. For example, heat generated by a processor may be dissipated by creating a flow of air using a fan or blower. Further, various platform-level cooling devices may be implemented in conjunction with the fan or blower to enhance heat dissipation, such as heat pipes, heat spreaders, heat sinks, vents, phase change materials or liquid-based coolants.

Traditional blowers used in portable computing systems generate a flow of air from an inlet parallel to the axis of rotation (e.g. the axial direction) to an outlet substantially perpendicular to the axis of rotation. This may be problematic in notebook computers, for example, because these traditional fans require inlet gaps above and/or below the fan housing. Because of the size constraints of a notebook computer, the cooling capacity of traditional systems is thermally limited by the size of fan that can be accommodated inside a notebook computer housing while allowing sufficient space for inlet gaps above and/or below the fan housing. Furthermore, the form factor of notebook computers continues to decrease in size, resulting in less available space for cooling components. Consequently, a need exists for improved cooling techniques for notebook computers.

BRIEF DESCRIPTION OF THE DRAWINGS

The detailed description is described with reference to the accompanying figures.

FIG. 1 is a schematic illustration of an electronic device which may be modified to include an blower assembly in accordance with some embodiments.

DETAILED DESCRIPTION

Figure 2A:
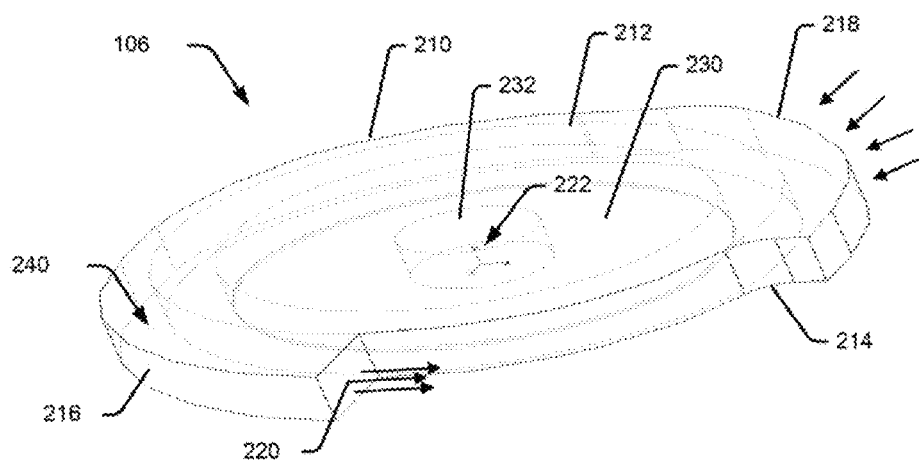
FIG. 2A is a schematic, perspective view illustration of a blower in accordance with some embodiments.

Described herein are exemplary embodiments of a blower assembly for an electronic devices. In the following description, numerous specific details are set forth to provide a thorough understanding of various embodiments. However, it will be understood by those skilled in the art that the various embodiments may be practiced without the specific details. In other instances, well-known methods, procedures, components, and circuits have not been illustrated or described in detail so as not to obscure the particular embodiments.

Any reference herein to "one embodiment" or "an embodiment" means that a particular feature, structure, or characteristic described in connection with the embodiment is included in at least one embodiment. The appearances of the phrases "in one embodiment" and "in an embodiment" in various places in the specification are not necessarily all referring to the same embodiment.

FIG. 1 is a schematic illustration of an electronic device 100 which may be modified to include a blower assembly in accordance with some embodiments. Electronic device 100 may comprise an ultrathin notebook computer having an internal housing height of 8.0 mm or less in some embodiments. As shown in FIG. 1, electronic device 100 comprises multiple elements, such a housing 101, a blower 106, motor 108, keyboard 111, heat sink 118 and display 120. The embodiments of electronic device 100, however, are not limited to the elements shown in this figure.

In various embodiments, blower 106 may comprise a fan or blower arranged to create a side-in, side-out flow of air through the blower in a direction perpendicular to the axis of rotation of the blower. Other embodiments are described and claimed.

Motor 108 may comprise any suitable electric motor capable of rotating side-in, side-out blower 106 to create a flow of air in some embodiments. In various embodiments, motor 108 may comprise an AC motor, brushed DC motor or brushless DC motor. For example, motor 108 may comprise a DC motor powered by an internal or external power source of apparatus 100. In some embodiments, motor 108 may comprise a tip-drive motor or an ultrathin motor. The size, location within housing 101, and location with respect to side-in, side-out blower 106 may be selected based on the size and performance constraints of a particular implementation.

In various embodiments, housing 101 may include a first section 102 and a second section 104. In some embodiments, a portion of the first section 102 may be recessed in a direction of the second section 104. The recessed portion 110 of the housing 101 may be configured to accommodate a keyboard assembly such as keyboard 111 such that the keys of keyboard 111 may be depressed below a top surface of the first section 102 of the housing 101. The housing may have a first internal height 112 between the first section 102 and the second section 104 and a second internal height 114 between the recessed portion 110 of the first section 102 and the second section.

In some embodiments, a portion of the blower 106 may be positioned between the recessed portion 110 of the first section 102 and the second section 104. In this configuration, for example, the blower 106 may have an axial height that is approximately equal to the second internal height 114. Other heights may be used and still fall within the described embodiments. Furthermore, it should be understood that adequate space between the blower 106 and the internal surfaces of the housing 101 should be provided such that the blower 106 does not contact the internal surfaces of the housing 101 when it is operated. In various embodiments the surface features of the areas surrounding the blower 106 may be configured to minimize leakage and minimize drag on the blower 106.

A motor 108 may be positioned above or below the blower 106, for example. In various embodiments, the motor 108 may be positioned between the blower 106 and the first section 102. In some embodiments, the motor 108 may have a height that is approximately equal to a difference between the first internal height 112 and the second internal height 114 or a difference between the first internal height 112 and the axial height of the blower 106. In this manner, the total internal height (e.g. height 112) may be fully utilized by the combination of blower 106 and motor 108.

In some embodiments, motor 108 may be positioned centrally above the axis of blower 106 and may control or spin the blower 106 to generate a flow of air 116. Furthermore, the motor 108 may be located between keyboard 111 and display 120, which may be coupled to housing 101 such that the display 120 may be rotated with respect to the housing 101, in some embodiments. In various embodiments, a heat sink 118 or other heat dissipation component may be located downstream from the blower 106 to assist with heat dissipation for the electronic device 100.

Aspects of a blower 106 will be explained with reference to FIGS. 2A and 2B. Referring first to FIG. 2A in some embodiments a blower 106 comprises a case 210 comprising a first surface 212, a second surface 214 opposite the first surface 210, and a side wall 216 extending between portions of the first surface 212 and the second surface 214. In some embodiments the side wall 216 comprises an air inlet 218 and an air outlet 220. In some embodiments the air inlet 218 may be substantially larger than the air outlet 220.

In some embodiments an impeller 230 is disposed in the case 210 and rotatable about a central axis extending between the first surface 210 and the second surface 212. A conventional Cartesian coordinate system 222 may be overlaid on the hub 232 of the impeller, and in such a coordinate system the impeller may be rotatable in the (x,y) plane and about the z axis.

Figure 2B:
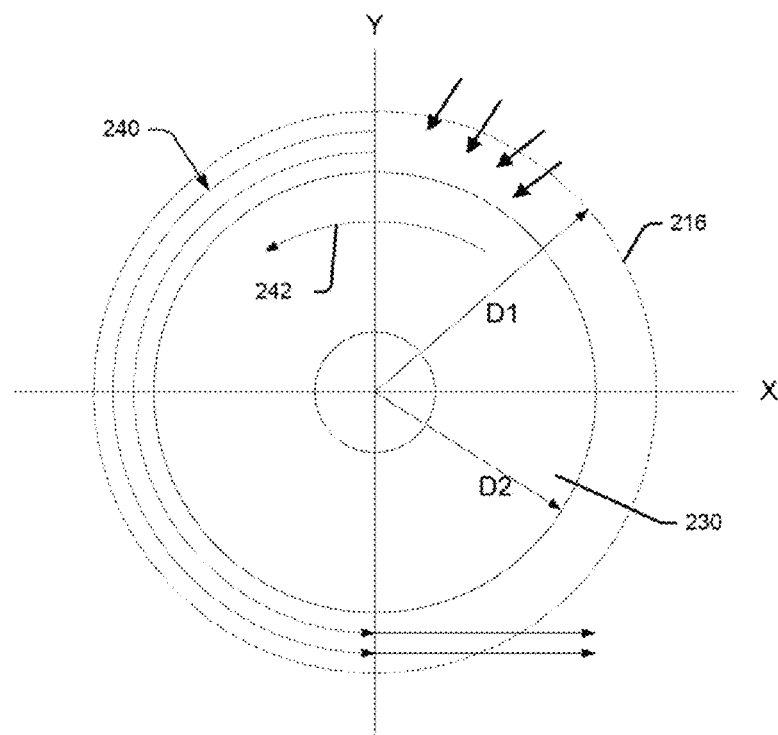
FIG. 2B is a schematic, perspective plan illustration of portions of a blower in accordance with some embodiments.

In some embodiments portions of the side wall 216 are disposed at a first distance, indicated by D1 on FIG. 2B, from the central axis and the impeller 230 has a second distance, indicted by D2 on FIG. 2B, less than the first distance D1, from the central axis. In such embodiments the impeller 230 defines a circumferential airflow path 240 within the case 210. In some embodiments the first distance D1 measures at least 10 millimeters greater than the second distance D2. In operation, the impeller 230 rotates about the central axis in the (x,y) plane to create an airflow in the circumferential airflow path 240 between air inlet 218 and the air outlet 220.

In some embodiments the impeller 230 is substantially centrally located within the case 210. The central axis about which the impeller 230 rotates lies within a plane perpendicular to the plane of rotation of the impeller 230, and the air outlet 220 is disposed in a second plane, substantially perpendicular to the plane in which the impeller 230 rotates. Further, in some embodiments the air outlet 220 is disposed within approximately 5 millimeters of the plane perpendicular to the plane of rotation of the impeller which includes the central axis, represented by the Y axis on FIG. 2B.

In some embodiments, impeller 230 may comprise a rotor configured to increase the pressure and/or flow of air in some embodiments. The blades of the impeller 230 may be any size, shape, number or configuration suitable for inducing the circumferential flow of air. In some embodiments, the plurality of blades of impeller 230 may be spaced unevenly to improve the acoustic characteristics of blower 106. In various embodiments, the number of blades may be selected to reduce resonant acoustic noise created by the blower 106 in a predefined frequency range or feathering or notching of the blades of the impeller 230 may be utilized to reduce coherent noise production. In some embodiments the blades may be constructed from a foam material. Furthermore, passive or active noise cancellation components may optionally be included along with a blower system to reduce resonant noise generated by the impeller 230 in some embodiments. Other embodiments are described and claimed.

In operation, when motor 108 is activated it drives impeller 230, causing impeller 230 to rotate in the direction indicated by arrow 242. Rotation of the impeller 230 generates an airflow through air inlet 218, through circumferential airflow path 240 and out the air outlet 220, as indicated in FIGS. 2A and 2B.

In some embodiments the motor 108 may be positioned within the blower case 210. by way of example, the motor 108 may be positioned within a radius of the impeller 230 of the blower 106. For example, a portion or the entire radius of the motor 108 may overlap with a portion or the entire radius of the impeller 230 of blower 106. In this arrangement, the combined height of the motor 108 and the blower 106 may be approximately equal to an internal height of an enclosure for the apparatus, such as height 114 of enclosure 101 of FIG. 1. In some embodiments, motor 106 may be located entirely inside the radius of rotor 230 such that motor 106 does not overlap with the blades of rotor 230 to reduce the possibility of mechanical interference between the motor 108 and the blades of rotor 230.

The above described embodiments may be used to improve airflow in ultrathin notebooks having internal heights (e.g. first internal height 112 of FIG. 1) of 8.0 mm or less. In some embodiments, an internal height of 8.0 mm may correspond to a notebook having an exterior thickness of 0.5-0.8 inches, for example.

Figure 3:
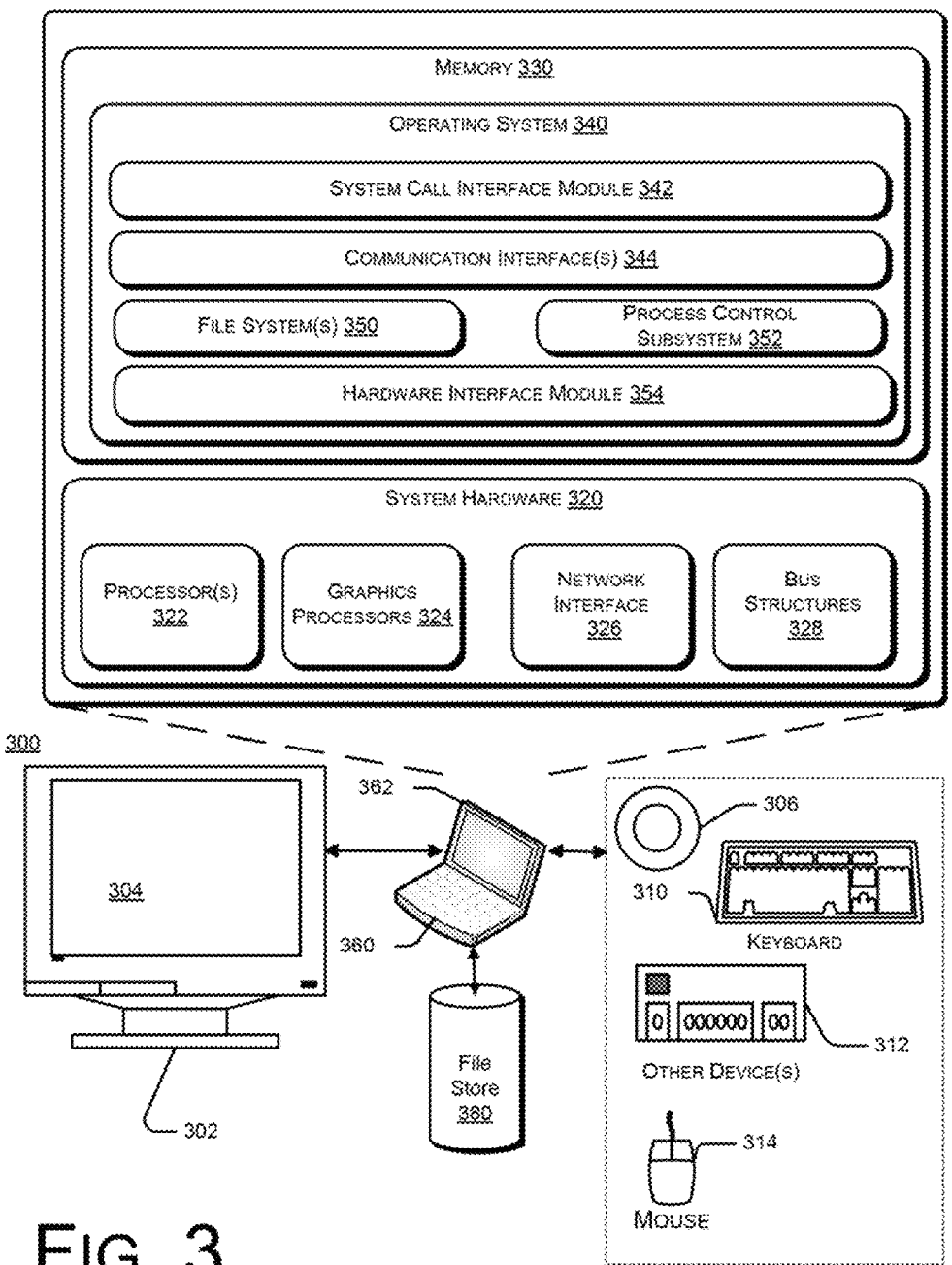
FIGS. 3 and 4 are schematic illustrations of an electronic device which may be adapted to include a blower, according to an embodiment.

In some embodiments a blower system such as that depicted in FIGS. 2A-2B may be used in an electronic device such as in an ultrathin notebook to provide enhanced cooling capability compared to traditional cooling methods that rely on centrifugal blowers that require inlet gaps above and/or below the blower in order to draw air through the notebook. FIG. 3 is a schematic illustration of an exemplary electronic device 300 in accordance with some embodiments. In one embodiment, electronic device 300 may include one or more accompanying input/output devices such as one or more speakers 306, a keyboard 310, one or more other I/O device(s) 312, and a mouse 314. The other I/O device(s) 312 may include a touch screen, a voice-activated input device, a track ball, and any other device that allows the electronic device 300 to receive input from a user.

In various embodiments, the electronic device 300 may be embodied as a personal computer, a laptop computer, a personal digital assistant, a mobile telephone, an entertainment device, or another computing device. The electronic device 300 includes system hardware 320 and memory 330, which may be implemented as random access memory and/or read-only memory. A file store 380 may be communicatively coupled to electronic device 300. File store 380 may be internal to electronic device 300 such as, e.g., one or more hard drives, CD-ROM drives, DVD-ROM drives, or other types of storage devices. File store 380 may also be external to computer 108 such as, e.g., one or more external hard drives, network attached storage, or a separate storage network.

System hardware 320 may include one or more processors 322, graphics processors 324, network interfaces 326, and bus structures 328. In one embodiment, processor 322 may be embodied as an Intel® Core2 Duo® processor available from Intel Corporation, Santa Clara, Calif., USA. As used herein, the term "processor" means any type of computational element, such as but not limited to, a microprocessor, a microcontroller, a complex instruction set computing (CISC) microprocessor, a reduced instruction set (RISC) microprocessor, a very long instruction word (VLIW) microprocessor, or any other type of processor or processing circuit.

In some embodiments one of the processors 322 in system hardware 320 may comprise a low-power embedded processor, referred to herein as a manageability engine (ME). The manageability engine 322 may be implemented as an independent integrated circuit or may be a dedicated portion of a larger processor 322.

Graphics processor(s) 324 may function as adjunct processor that manages graphics and/or video operations. Graphics processor(s) 324 may be integrated onto the motherboard of computing system 300 or may be coupled via an expansion slot on the motherboard.

In one embodiment, network interface 326 could be a wired interface such as an Ethernet interface (see, e.g., Institute of Electrical and Electronics Engineers/IEEE 802.3-2002) or a wireless interface such as an IEEE 802.11a, b or g-compliant interface (see, e.g., IEEE Standard for IT-Telecommunications and information exchange between systems LAN/MAN-Part II: Wireless LAN Medium Access Control (MAC) and Physical Layer (PHY) specifications Amendment 4: Further Higher Data Rate Extension in the 2.4 GHz Band, 802.11G-2003). Another example of a wireless interface would be a general packet radio service (GPRS) interface (see, e.g., Guidelines on GPRS Handset Requirements, Global System for Mobile Communications/GSM Association, Ver. 3.0.1, December 2002).

Bus structures 328 connect various components of system hardware 328. In one embodiment, bus structures 328 may be one or more of several types of bus structure(s) including a memory bus, a peripheral bus or external bus, and/or a local bus using any variety of available bus architectures including, but not limited to, 11-bit bus, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Universal Serial Bus (USB), Advanced Graphics Port (AGP), Personal Computer Memory Card International Association bus (PCMCIA), and Small Computer Systems Interface (SCSI).

Memory 330 may include an operating system 340 for managing operations of computing electronic device 300. In one embodiment, operating system 340 includes a hardware interface module 354 that provides an interface to system hardware 320. In addition, operating system 340 may include a file system 350 that manages files used in the operation of electronic device 300 and a process control subsystem 352 that manages processes executing on electronic device 300.

Operating system 340 may include (or manage) one or more communication interfaces 344 that may operate in conjunction with system hardware 320 to transceiver data packets and/or data streams from a remote source. Operating system 340 may further include a system call interface module 342 that provides an interface between the operating system 340 and one or more application modules resident in memory 330. Operating system 340 may be embodied as a UNIX operating system or any derivative thereof (e.g., Linux, Solaris, etc.) or as a Windows® brand operating system, or other operating systems.

In one embodiment, electronic device 300, comprises a clamshell body which includes a first section 360, commonly referred to as a base, which houses a keyboard, a motherboard, and other components, and a second section 362 which houses a display. The first section 360 and the second section 362 are connected by a hinge assembly which enables the clamshell body to open and close.

Figure 4:
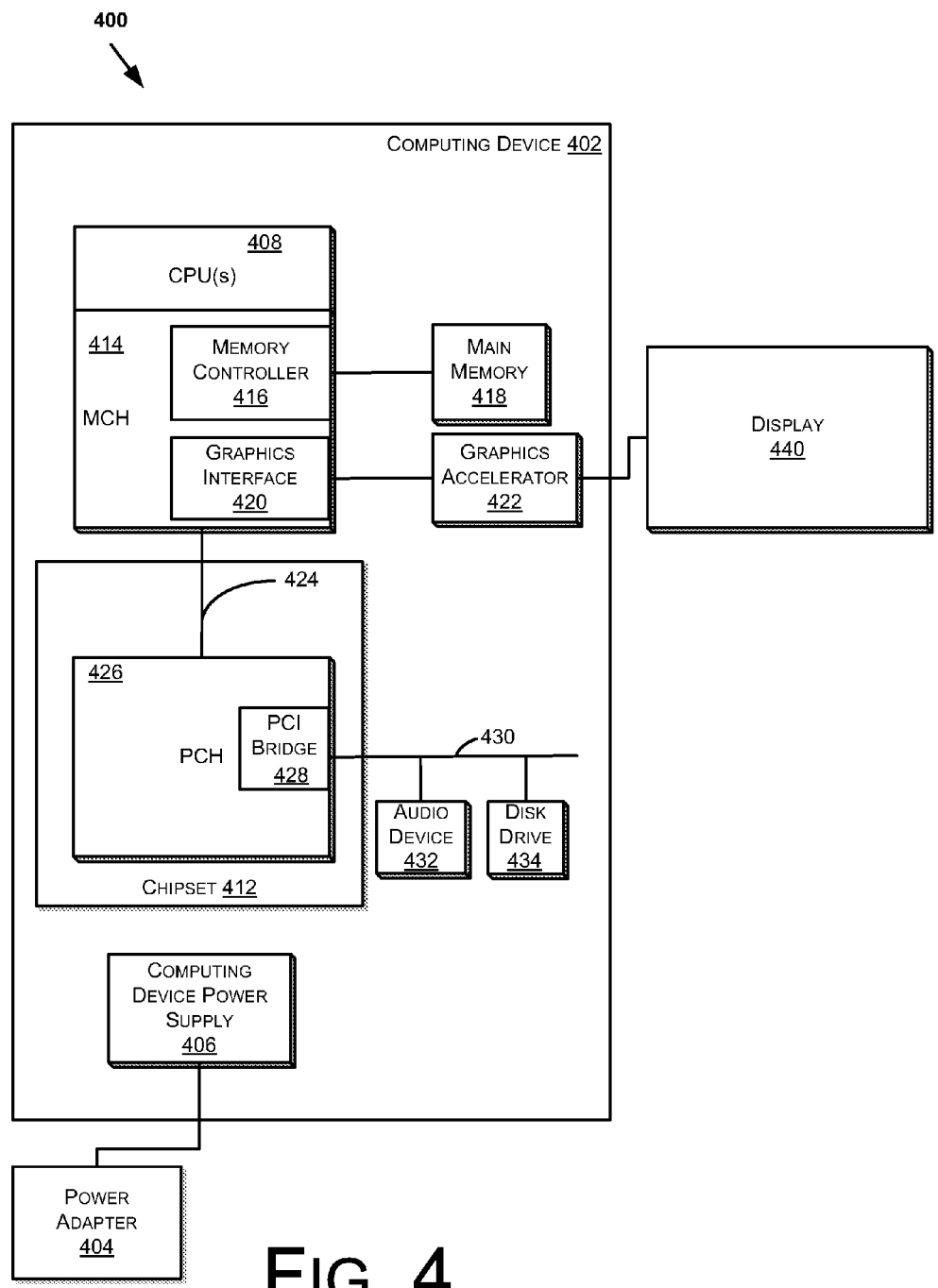

FIG. 4 is a schematic illustration of a computer system 400 in accordance with some embodiments. The computer system 400 includes a computing device 402 and a power adapter 404 (e.g., to supply electrical power to the computing device 402). The computing device 402 may be any suitable computing device such as a laptop (or notebook) computer, a personal digital assistant, a desktop computing device (e.g., a workstation or a desktop computer), a rack-mounted computing device, and the like.

Electrical power may be provided to various components of the computing device 402 (e.g., through a computing device power supply 406) from one or more of the following sources: one or more battery packs, an alternating current (AC) outlet (e.g., through a transformer and/or adaptor such as a power adapter 404), automotive power supplies, airplane power supplies, and the like. In some embodiments, the power adapter 404 may transform the power supply source output (e.g., the AC outlet voltage of about 110 VAC to 240 VAC) to a direct current (DC) voltage ranging between about 5 VDC to 12.6 VDC. Accordingly, the power adapter 404 may be an AC/DC adapter.

The computing device 402 may also include one or more central processing unit(s) (CPUs) 408. In some embodiments, the CPU 408 may be one or more processors in the Pentium® family of processors including the Pentium® II processor family, Pentium® III processors, Pentium® IV, or CORE2 Duo processors available from Intel® Corporation of Santa Clara, Calif. Alternatively, other CPUs may be used, such as Intel's Itanium®, XEON™, and Celeron® processors. Also, one or more processors from other manufactures may be utilized. Moreover, the processors may have a single or multi core design.

A chipset 412 may be coupled to, or integrated with, CPU 408. The chipset 412 may include a memory control hub (MCH) 414. The MCH 414 may include a memory controller 416 that is coupled to a main system memory 418. The main system memory 418 stores data and sequences of instructions that are executed by the CPU 408, or any other device included in the system 400. In some embodiments, the main system memory 418 includes random access memory (RAM), however, the main system memory 418 may be implemented using other memory types such as dynamic RAM (DRAM), synchronous DRAM (SDRAM), and the like. Additional devices may also be coupled to the bus 410, such as multiple CPUs and/or multiple system memories.

The MCH 414 may also include a graphics interface 420 coupled to a graphics accelerator 422. In some embodiments, the graphics interface 420 is coupled to the graphics accelerator 422 via an accelerated graphics port (AGP). In some embodiments, a display (such as a flat panel display) 440 may be coupled to the graphics interface 420 through, for example, a signal converter that translates a digital representation of an image stored in a storage device such as video memory or system memory into display signals that are interpreted and displayed by the display. The display 440 signals produced by the display device may pass through various control devices before being interpreted by and subsequently displayed on the display.

A hub interface 424 couples the MCH 414 to an platform control hub (PCH) 426. The PCH 426 provides an interface to input/output (I/O) devices coupled to the computer system 400. The PCH 426 may be coupled to a peripheral component interconnect (PCI) bus. Hence, the PCH 426 includes a PCI bridge 428 that provides an interface to a PCI bus 430. The PCI bridge 428 provides a data path between the CPU 408 and peripheral devices. Additionally, other types of I/O interconnect topologies may be utilized such as the PCI Express™ architecture, available through Intel® Corporation of Santa Clara, Calif.

The PCI bus 430 may be coupled to an audio device 432 and one or more disk drive(s) 434. Other devices may be coupled to the PCI bus 430. In addition, the CPU 408 and the MCH 414 may be combined to form a single chip. Furthermore, the graphics accelerator 422 may be included within the MCH 414 in other embodiments.

Additionally, other peripherals coupled to the PCH 426 may include, in various embodiments, integrated drive electronics (IDE) or small computer system interface (SCSI) hard drive(s), universal serial bus (USB) port(s), a keyboard, a mouse, parallel port(s), serial port(s), floppy disk drive(s), digital output support (e.g., digital video interface (DVI)), and the like. Hence, the computing device 402 may include volatile and/or nonvolatile memory.

The terms "logic instructions" as referred to herein relates to expressions which may be understood by one or more machines for performing one or more logical operations. For example, logic instructions may comprise instructions which are interpretable by a processor compiler for executing one or more operations on one or more data objects. However, this is merely an example of machine-readable instructions and embodiments are not limited in this respect.

The terms "computer readable medium" as referred to herein relates to media capable of maintaining expressions which are perceivable by one or more machines. For example, a computer readable medium may comprise one or more storage devices for storing computer readable instructions or data. Such storage devices may comprise storage media such as, for example, optical, magnetic or semiconductor storage media. However, this is merely an example of a computer readable medium and embodiments are not limited in this respect.

The term "logic" as referred to herein relates to structure for performing one or more logical operations. For example, logic may comprise circuitry which provides one or more output signals based upon one or more input signals. Such circuitry may comprise a finite state machine which receives a digital input and provides a digital output, or circuitry which provides one or more analog output signals in response to one or more analog input signals. Such circuitry may be provided in an application specific integrated circuit (ASIC) or field programmable gate array (FPGA). Also, logic may comprise machine-readable instructions stored in a memory in combination with processing circuitry to execute such machine-readable instructions. However, these are merely examples of structures which may provide logic and embodiments are not limited in this respect.

Some of the methods described herein may be embodied as logic instructions on a computer-readable medium. When executed on a processor, the logic instructions cause a processor to be programmed as a special-purpose machine that implements the described methods. The processor, when configured by the logic instructions to execute the methods described herein, constitutes structure for performing the described methods. Alternatively, the methods described herein may be reduced to logic on, e.g., a field programmable gate array (FPGA), an application specific integrated circuit (ASIC) or the like.

In the description and claims, the terms coupled and connected, along with their derivatives, may be used. In particular embodiments, connected may be used to indicate that two or more elements are in direct physical or electrical contact with each other. Coupled may mean that two or more elements are in direct physical or electrical contact. However, coupled may also mean that two or more elements may not be in direct contact with each other, but yet may still cooperate or interact with each other.

Reference in the specification to "one embodiment" or "some embodiments" means that a particular feature, structure, or characteristic described in connection with the embodiment is included in at least an implementation. The appearances of the phrase "in one embodiment" in various places in the specification may or may not be all referring to the same embodiment.

Although embodiments have been described in language specific to structural features and/or methodological acts, it is to be understood that claimed subject matter may not be limited to the specific features or acts described. Rather, the specific features and acts are disclosed as sample forms of implementing the claimed subject matter.

What is claimed is:

1. A blower, comprising:
   a case comprising a first surface, a second surface opposite the first surface, and a side wall extending between portions of the first surface and the second surface, wherein the side wall comprises an air inlet and an air outlet, wherein the air inlet is substantially larger than the air outlet;
   an impeller disposed in the case and rotatable about an axis of rotation extending between the first surface and the second surface;
   wherein portions of the side wall are disposed at least a first distance from the axis of rotation and the impeller defines a circumferential airflow path within the case; and
   wherein the impeller creates an airflow in the circumferential airflow path between the air inlet and the air outlet, wherein:
   the impeller rotates about an axis of rotation perpendicular to a first plane;
   the air outlet defines an aperture disposed in a second plane, substantially perpendicular to the first plane; and
   the second plane which comprises the aperture is disposed within 5 millimeters of and coplanar to a plane perpendicular to the first plane which includes the axis of rotation.

2. The blower of claim 1, wherein the impeller comprises blades constructed from a porous material.

3. The blower of claim 1, wherein:
   portions of the impeller are disposed at a second distance from the axis of rotation; and
   the first distance measures at least 10 millimeters greater than the second distance.

4. The blower of claim 1, wherein the impeller is centrally located within the case.

5. The blower of claim 1, further comprising a motor coupled to the impeller to rotate the impeller about the axis of rotation.

6. A housing for an electronic device, comprising:
   a first section and a second section coupled to the first section to define an internal chamber;
   a motor disposed in the internal chamber; and
   a blower coupled to the motor, the blower comprising:
     a case comprising a first surface, a second surface opposite the first surface, and a side wall extending between portions of the first surface and the second surface, wherein the side wall comprises an air inlet and an air outlet, wherein the air inlet is substantially larger than the air outlet;
     an impeller disposed in the case and rotatable about an axis of rotation extending between the first surface and the second surface;
     wherein portions of the side wall are disposed at least a first distance from the axis of rotation and the impeller defines a circumferential airflow path within the case; and wherein the impeller creates an airflow in the circumferential airflow path between the air inlet and the air outlet, wherein:

the impeller rotates about an axis of rotation perpendicular to a first plane;

the air outlet defines an aperture disposed in a second plane, substantially perpendicular to the first plane; and the second plane which comprises the aperture is disposed within 5 millimeters of and coplanar to a plane perpendicular to the first plane which includes the axis of rotation.

7. The housing of claim 6, wherein the impeller comprises blades constructed from a porous material.

8. The housing of claim 6, wherein:
portions of the impeller are disposed at a second distance from the axis of rotation; and
the first distance measures at least 10 millimeters greater than the second distance.

9. The housing of claim 6, wherein the impeller is centrally located within the case.

10. The housing of claim 6, wherein the impeller comprises a rotor configured to increase at least one of the air pressure in the case or the airflow through the case.

11. An electronic device, comprising:
a housing, comprising:
a first section and a second section coupled to the first section to define an internal chamber;
at least one heat producing component disposed in the internal chamber;
a motor disposed in the internal chamber; and
a blower coupled to the motor, the blower comprising:
a case comprising a first surface, a second surface opposite the first surface, and a side wall extending between portions of the first surface and the second surface, wherein the side wall comprises an air inlet and an air outlet, wherein the air inlet is substantially larger than the air outlet;
an impeller disposed in the case and rotatable about an axis of rotation extending between the first surface and the second surface;
wherein portions of the side wall are disposed at least a first distance from the axis of rotation and the impeller defines a circumferential airflow path within the case; and
wherein the impeller creates an airflow in the circumferential airflow path between the air inlet and the air outlet, and wherein:
the impeller rotates about an axis of rotation perpendicular to a first plane;
the air outlet defines an aperture disposed in a second plane, substantially perpendicular to the first plane; and
the second plane which comprises the aperture is disposed within 5 millimeters of and coplanar to a plane perpendicular to the first plane which includes the axis of rotation.

12. The electronic device of claim 11, wherein the impeller comprises blades constructed from a porous material.

13. The electronic device of claim 11, wherein:
portions of the impeller are disposed at a second distance from the axis of rotation; and
the first distance measures at least 10 millimeters greater than the second distance.

14. The electronic device of claim 11, wherein the impeller is centrally located within the case.

15. The electronic device of claim 11, wherein the impeller comprises a rotor configured to increase at least one of the air pressure in the case or the airflow through the case.

* * * * *